United States Patent
Li et al.

(10) Patent No.: US 12,038,591 B2
(45) Date of Patent: Jul. 16, 2024

(54) POLYMER PATTERNED DISK STACK MANUFACTURING

(71) Applicant: Magic Leap, Inc., Plantation, FL (US)

(72) Inventors: Ling Li, Cedar Park, TX (US); Chieh Chang, Cedar Park, TX (US); Sharad D. Bhagat, Austin, TX (US); Christophe Peroz, San Francisco, CA (US); Brian George Hill, Duxbury, MA (US); Roy Matthew Patterson, Hutto, TX (US); Satish Sadam, Round Rock, TX (US)

(73) Assignee: Magic Leap, Inc., Plantation, FL (US)

( * ) Notice: Subject to any disclaimer, the term of this patent is extended or adjusted under 35 U.S.C. 154(b) by 1059 days.

(21) Appl. No.: 16/909,760

(22) Filed: Jun. 23, 2020

(65) Prior Publication Data

US 2020/0402871 A1 Dec. 24, 2020

Related U.S. Application Data

(60) Provisional application No. 62/892,427, filed on Aug. 27, 2019, provisional application No. 62/865,715, filed on Jun. 24, 2019.

(51) Int. Cl.
*B29C 39/02* (2006.01)
*G02B 3/00* (2006.01)
*G02B 27/42* (2006.01)

(52) U.S. Cl.
CPC .......... *G02B 3/0062* (2013.01); *B29C 39/026* (2013.01); *G02B 27/4272* (2013.01)

(58) Field of Classification Search
CPC .............................. G02B 3/0062; B29C 39/026
See application file for complete search history.

(56) References Cited

U.S. PATENT DOCUMENTS

| 6,362,883 B1 | 3/2002 | Watkins |
| 2005/0194427 A1 | 9/2005 | Jimarez |

(Continued)

FOREIGN PATENT DOCUMENTS

| CN | 101063810 A | 10/2007 |
| CN | 101135860 A | 3/2008 |

(Continued)

OTHER PUBLICATIONS

Application No. EP20831404.7, "Extended European Search Report", Aug. 12, 2022, 8 pages.

(Continued)

*Primary Examiner* — Tarifur R Chowdhury
*Assistant Examiner* — Kemaya Nguyen
(74) *Attorney, Agent, or Firm* — KILPATRICK TOWNSEND & STOCKTON LLP

(57) ABSTRACT

A method of aligning a stencil to an eyepiece wafer includes providing the stencil, positioning the stencil with respect to a first light source, and determining locations of at least two stencil apertures. The method also includes providing the eyepiece wafer. The eyepiece wafer includes at least two eyepiece waveguides, each eyepiece waveguide including an incoupling grating and a corresponding diffraction pattern. The method further includes directing light from one or more second light sources to impinge on each of the corresponding diffraction patterns, imaging light diffracted from each incoupling grating, determining at least two incoupling grating locations, determining offsets between corresponding stencil aperture locations and incoupling grating locations, and aligning the stencil to the eyepiece wafer based on the determined offsets.

11 Claims, 12 Drawing Sheets

(56) References Cited

U.S. PATENT DOCUMENTS

| | | | |
|---|---|---|---|
| 2013/0050674 A1 | 2/2013 | Prosyentsov et al. | |
| 2016/0231566 A1* | 8/2016 | Levola | G02B 6/00 |
| 2018/0052277 A1* | 2/2018 | Schowengerdt | G06F 1/206 |
| 2018/0052501 A1* | 2/2018 | Jones, Jr. | G02B 6/0016 |
| 2018/0188528 A1* | 7/2018 | Browy | G02B 27/0081 |
| 2019/0049861 A1 | 2/2019 | Van Voorst et al. | |
| 2019/0111642 A1 | 4/2019 | Chang et al. | |
| 2019/0137777 A1 | 5/2019 | Yang et al. | |
| 2019/0383697 A1* | 12/2019 | Yang | G02B 13/22 |

FOREIGN PATENT DOCUMENTS

| | | | |
|---|---|---|---|
| CN | 101945754 | A | 1/2011 |
| CN | 106097899 | A | 11/2016 |
| CN | 107924085 | A | 4/2018 |
| CN | 108474945 | A | 8/2018 |
| CN | 109097727 | A | 12/2018 |
| CN | 109891298 | A | 6/2019 |
| EP | 0409573 | A2 | 1/1991 |
| EP | 0455443 | A2 | 11/1991 |
| WO | 2005083789 | A2 | 9/2005 |

OTHER PUBLICATIONS

PCT/US2020/039204, "International Search Report and Written Opinion", Nov. 18, 2020, 9 pages.

PCT/US2020/039204, "Invitation to Pay Additional Fees and, Where Applicable, Protest Fee", Sep. 14, 2020, 2 pages.

Application No. PCT/US2020/039204 , International Preliminary Report on Patentability, mailed on Jan. 6, 2022, 6 pages.

Application No. CN202080046016.X, "Office Action", Mar. 17, 2023, 11 pages. [No translation available].

CN202080046016.X, "Office Action" and English translation, Nov. 4, 2023, 6 pages.

* cited by examiner

POLYMER PATTERNED DISK STACK MANUFACTURING

CROSS-REFERENCES TO RELATED APPLICATIONS

This application claims the benefit of priority to U.S. Provisional Patent Application No. 62/865,715, filed on Jun. 24, 2019, entitled "POLYMER PATTERNED DISK STACK MANUFACTURING," and U.S. Provisional Patent Application No. 62/892,427, filed on Aug. 27, 2019, entitled "POLYMER PATTERNED DISK STACK MANUFACTURING" the entire contents of which are hereby incorporated by reference for all purposes.

BACKGROUND OF THE INVENTION

Modern computing and display technologies have facilitated the development of systems for "virtual reality" or "augmented reality" experiences, wherein digitally reproduced images or portions thereof are presented to a viewer in a manner wherein they seem to be, or may be perceived as real. A virtual reality, or "VR" scenario typically involves presentation of digital or virtual image information without transparency to other actual real-world visual input; an augmented reality, or "AR," scenario typically involves presentation of digital or virtual image information as an augmentation to visualization of the actual world around the viewer.

Despite the progress made in these display technologies, there is a need in the art for improved methods and systems related to augmented reality systems.

SUMMARY OF THE INVENTION

Embodiments of the present invention relate to assembly tools and methods for fabricating and assembling multi-layered eyepieces.

Systems and methods for producing multi-layered polymer eyepiece stacks are described. In particular, an enclosed tool to perform more than one fabrication and/or assembly step is described. In some embodiments, an enclosed tool is configured to produce a multi-layered polymer eyepiece. The enclosed tool can include equipment or stations used to perform fabrication and assembly steps relating to casting, curing, coating, aligning, stacking, singulating, and/or edge finishing multi-layered polymer eyepiece stacks. Performing multiple fabrication steps within an enclosed tool can improve output quality of the multi-layered polymer eyepiece stacks by limiting contamination of the eyepieces by dust or other particles in the fabrication area. A further advantage of an enclosed, integrated tool is that throughput can be increased by synchronizing fabrication and assembly steps. Cost savings can be achieved using an enclosed tool by eliminating the need for a clean room fabrication and assembly environment.

According to an embodiment of the present invention, a method of aligning a stencil to an eyepiece wafer is provided. The method includes providing the stencil, positioning the stencil with respect to a first light source, and determining locations of at least two stencil apertures. The method also includes providing the eyepiece wafer. The eyepiece wafer includes at least two eyepiece waveguides, each eyepiece waveguide including an incoupling grating and a corresponding diffraction pattern. The method further includes directing light from one or more second light sources to impinge on each of the corresponding diffraction patterns, imaging light diffracted from each incoupling grating, determining at least two incoupling grating locations, determining offsets between corresponding stencil aperture locations and incoupling grating locations, and aligning the stencil to the eyepiece wafer based on the determined offsets.

According to another embodiment of the present invention, a system is provided. The system includes a first chuck operable to support a stencil including a plurality of apertures, a wafer chuck operable to support and move a wafer including a plurality of incoupling gratings, and a first light source operable to direct light to impinge on a first surface of the stencil. The system also includes one or more second light sources operable to direct light to impinge on the wafer and one or more lens and camera assemblies. The one or more camera assemblies are operable to receive light from the first light source passing through the plurality of apertures in the stencil and receive light from the one or more second light sources diffracted from the plurality of incoupling gratings in the wafer. The system further includes an alignment system operable to move the wafer with respect to the stencil in order to reduce an offset between aperture locations and incoupling grating locations.

According to a specific embodiment of the present invention, an assembly system is provided. The assembly system includes a wafer casting station, a stencil placement station, and a deposition station. The assembly system also includes a stencil separation station, a first inspection station, a layer assembly station, and a second inspection station. In an embodiment, the stencil placement station includes a first chuck operable to support a stencil including a plurality of apertures, a wafer chuck operable to support and move a wafer including a plurality of incoupling gratings, a first light source operable to direct light to impinge on a first surface of the stencil, and one or more second light sources operable to direct light to impinge on the wafer. The stencil placement station also includes one or more lens and camera assemblies operable to receive light from the first light source passing through the plurality of apertures in the stencil and receive light from the one or more second light sources diffracted from the plurality of incoupling gratings in the wafer. The stencil placement station further includes an alignment system operable to move the wafer with respect to the stencil in order to reduce an offset between aperture locations and incoupling grating locations.

Numerous benefits are achieved by way of the present invention over conventional techniques. For example, embodiments of the present invention provide methods and systems that enable the fabrication of multi-layer eyepieces with high precision, particularly in relation to layer-to-layer alignment. Moreover, embodiments of the present invention utilize optical and diffractive structures present in the eyepiece to enable self-aligned assembly processes. These and other embodiments of the invention along with many of its advantages and features are described in more detail in conjunction with the text below and attached figures.

DETAILED DESCRIPTION OF SPECIFIC EMBODIMENTS

Embodiments of the present invention relate to assembly tools and methods for fabricating and assembling multi-layered eyepieces.

Figure 1:
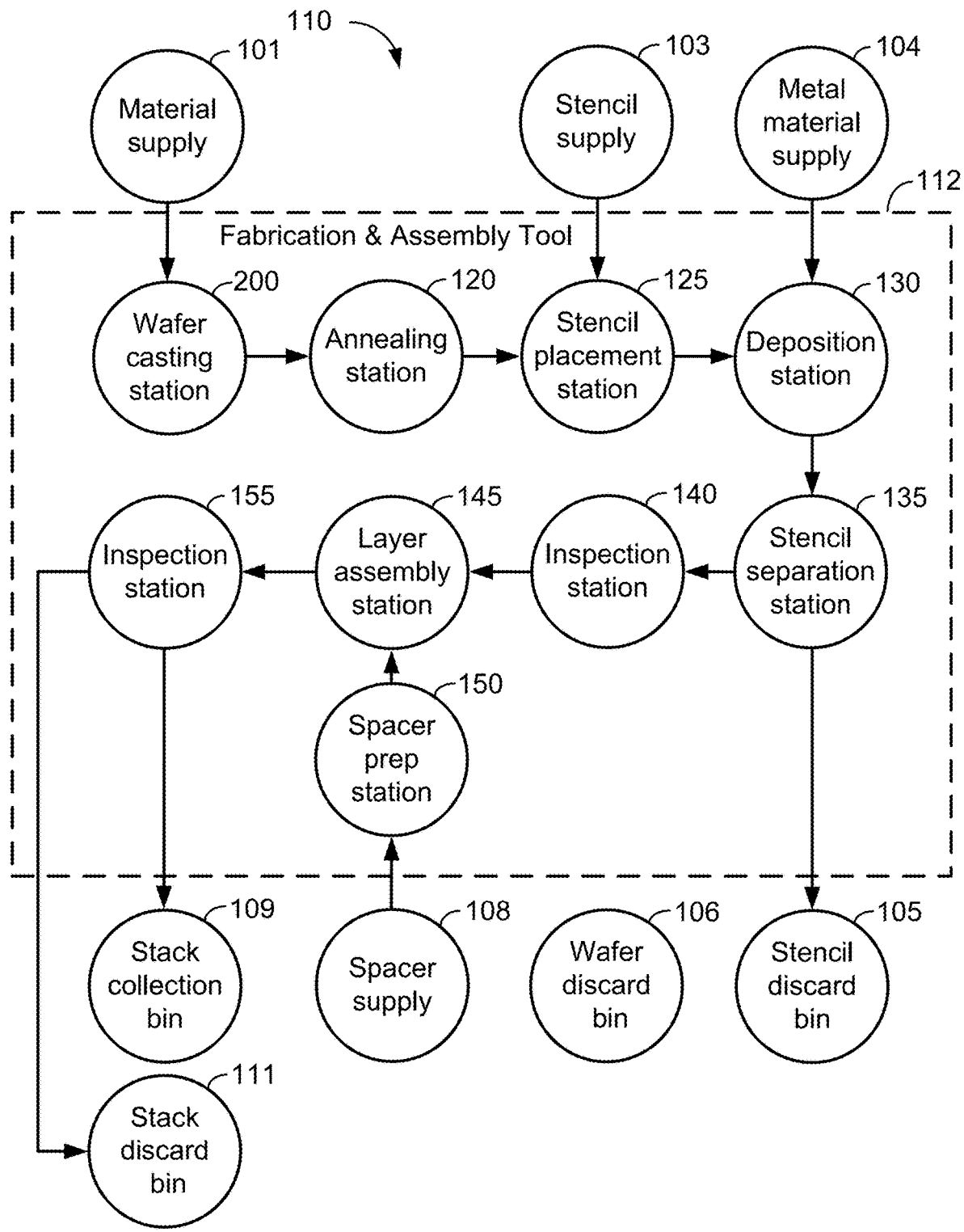
FIG. 1 shows an example schematic of equipment inside an enclosed fabrication and assembly tool according to an embodiment of the present invention.

FIG. 1 shows an example schematic of equipment inside an enclosed fabrication and assembly tool according to an embodiment of the present invention. Referring to FIG. 1, an example enclosed multi-layered polymer eyepiece fabrication and assembly tool 110 is shown. The tool 110 includes an enclosure 112 that houses equipment for fabricating and assembling polymer eyepiece stacks. In some embodiments, the enclosure 112 is sealed to prevent particles and contaminants from entering the interior where fabrication and assembly takes place. The enclosure 112 can house machinery that performs various fabrication and assembly steps. For example, the enclosure 112 can include one or more of a wafer casting station 200, an annealing station 120, a stencil placement station 125, a metal deposition station 130, a stencil separation station 135, a layer assembly station 145, and an inspection station 140. While each of these steps is represented as a separate station, it is possible to combine multiple tasks or functions into a single station or to subdivide tasks into more than one step.

Figure 2:
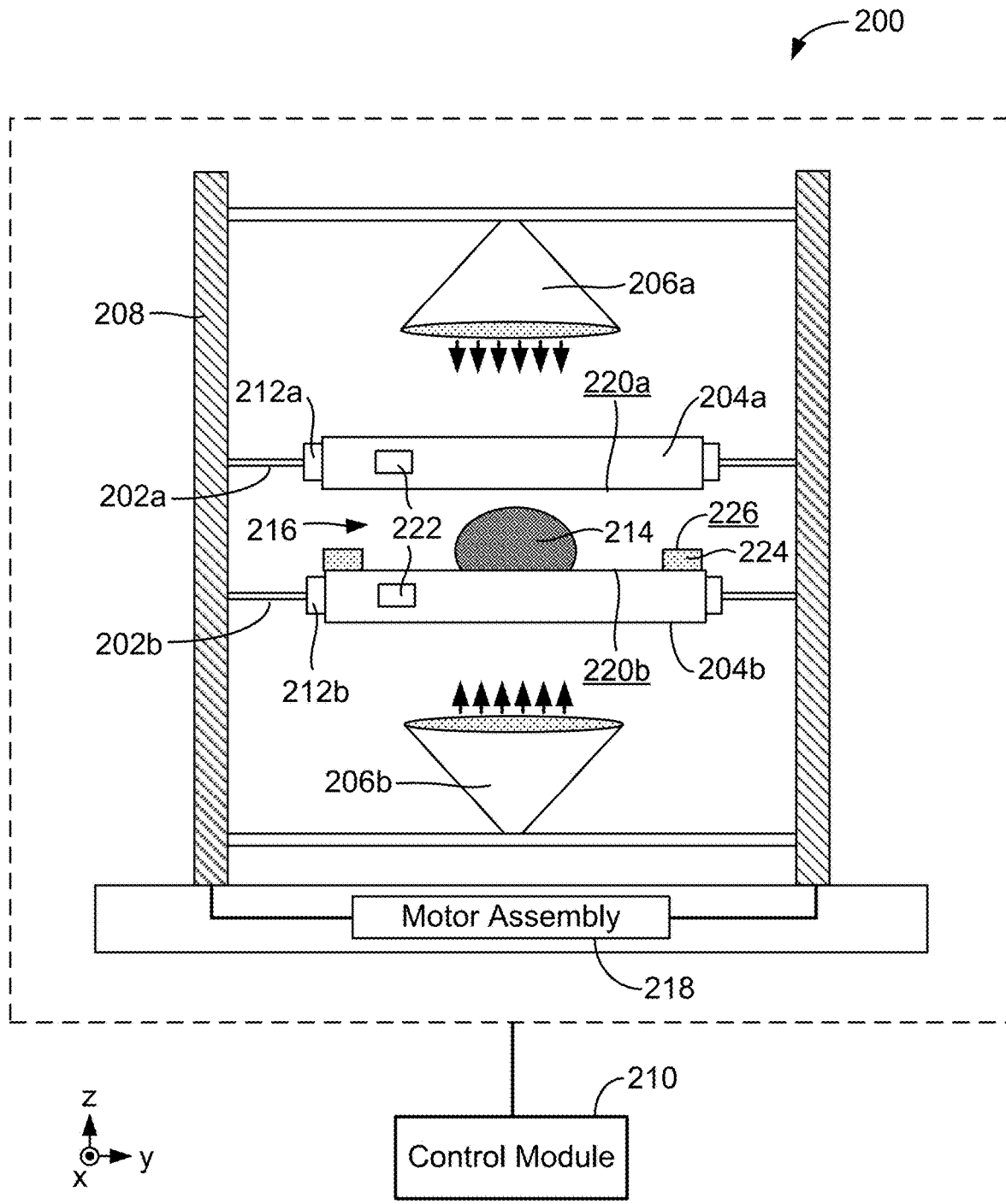
FIG. 2 shows a cross-sectional view of a polymer wafer casting station according to an embodiment of the present invention.

FIG. 2 shows a cross-sectional view of a polymer wafer casting station according to an embodiment of the present invention. Wafer casting station 200 receives a curable polymer resin material from a polymer material supply 101 (illustrated in FIG. 1) located either within or outside of enclosure 112. The casting station 200 outputs a patterned polymer wafer. The curable polymer resin can be a multi-part (e.g., two-part or three-part or more) polymer mixture that is cured in a mold using at least one of UV light and/or thermal energy.

Wafer casting station 200 includes two mold structures 204a and 204b (also referred to as "optical flats") secured to the actuable stages 212a and 212b, respectively (e.g., through clamps 202a and 202b). In some cases, the clamps 202a and 202b can be magnetic (e.g., electromagnets) and/or pneumatic clamps that enable the mold structures 204a and 204b to be reversibly mounted to and removed from the actuable stages 212a and 212b. In some cases, the clamps 202a and 202b can be controlled by a switch and/or by the control module 210 (e.g., by selectively applying electricity to the electromagnets of the clamps 202a and 202b and/or selectively actuating pneumatic mechanisms to engage or disengage the molds structures).

Figure 3:
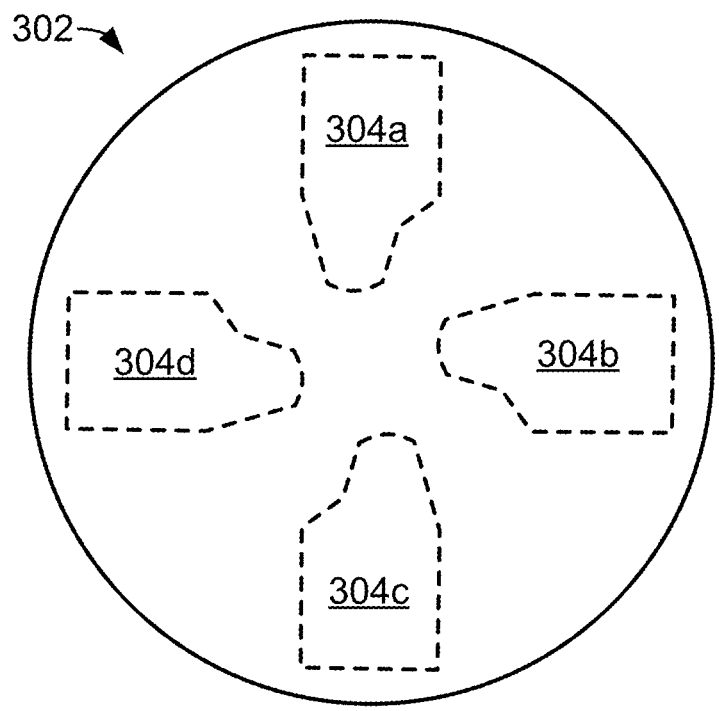
FIG. 3 shows a plan view of an example polymer wafer with eyepieces molded therein according to an embodiment of the present invention.

A curable polymer 214 (e.g., a photopolymer or light-activated resin that hardens when exposed to light) is deposited onto the mold structure 204b in opening 216 between the mold structure 204a and mold structure 204b. In some embodiments, the cured polymer material can have an index of refraction higher than about 1.5 (e.g. about 1.65 or higher). The mold structures 204a and 204b are moved into proximity with one another (e.g., by moving the actuable stages 212a and/or 212b vertically along the support frame 208 using motor assembly 218), such that the curable material 214 is enclosed by surfaces 220a and 220b of the mold structures 204a and 204b, respectively. In order to provide a predetermined spacing between mold structures 204a and 204b, spacers 224 can be utilized, with top surface 226 of spacers 224 making contact with surface 220a of mold structure 204a when in a mold forming position. The curable material 214 is then cured (e.g., by exposing the curable material 214 to light from the light sources 206a and/or 206b), forming a thin film having one or more features defined by the mold structures 204a and 204b. After the curable material 214 has been cured, the mold structures 204a and 204b are moved away from each other (e.g., by moving the actuable stages 212a and/or 212b vertically along the support frame 208), and the film is extracted. In some embodiments, the thin film can be a polymer wafer 302 as shown in FIG. 3 having one or more eyepieces 304a, 304b, 304c, and 304d molded therein. The eyepieces 304a, 304b, 304c, and 304d can be referred to as eyepiece waveguides. More or fewer than four eyepieces can be molded in the wafer. As an example, six eyepieces oriented at angles spaced by 60° can be utilized in a manner similar to the four eyepieces 304a, 304b, 304c, and 304d oriented at angles spaced by 90° as illustrated in FIG. 3. Thus, embodiments of the present invention are not limited to this particular implementation and other numbers of eyepieces can be fabricated on polymer wafer 302. Alternatively, in some embodiments a single polymer eyepiece layer is produced in a cast-to-shape method such that later singulation steps can be omitted. Additional information regarding casting equipment and methods are available in U.S. Patent Application Publication No. 2019/0111642, filed Oct. 17, 2018, which is hereby incorporated by reference in its entirety.

In some embodiments, two or three or more casting stations 200 can be included within the enclosure 112 of tool 110. Such a configuration allows for increased wafer production and can also allow for each casting station to fabricate polymer wafers from different polymer chemistries. For example, a first casting station can fabricate wafers from a first polymer formulation and a second casting station can fabricate wafers from a second polymer formulation that is different from the first, and so on.

After the molded polymer wafer is removed from the casting station, it optionally moves to an annealing station 120 where the wafer is heated to reduce material stress within the wafer, to increase thermal stability of the polymer material, and/or to fine tune the contour or flatness of the wafer. In some embodiments, the polymer wafer is placed on a substrate (e.g. a thermally conducting plate such as aluminum) that has a surface roughness of 100 nm or higher to prevent the polymer material from sticking to the substrate. It is desirable for the polymer wafer to be able to freely stretch and/or contract during the annealing process so that the polymer wafer can conform to the shape of the substrate. In some embodiments, the substrate is flat with low local thickness variation (LTV) and low total thickness variation (TTV). Alternatively, at least a portion of the substrate can include a concave or a convex curved surface such that the curve is imparted to the polymer wafer during annealing.

During annealing, gravity can be sufficient to cause the polymer wafer to conform to the shape of the annealing substrate; however, to increase shape conformity, a second substrate can be used as a weight on top of the polymer wafer such that the wafer is sandwiched in between the two substrates. The second substrate can also be a thermally conducing plate or can be a fused silica optical flat coated with a conducting metal layer or metal/metal oxide mixed layer.

The particular annealing recipe can depend on the particular polymer material. In some embodiments, the annealing step can include exposing the polymer wafer to a temperature higher than the glass transition temperature of the wafer (e.g., about 100° C. for some materials). Ramping down of the temperature toward room temperature can occur slowly at temperatures near the glass transition temperature (e.g., at a rate less than about 2° C. per minute) to reduce risk of the polymer wafer bowing or warping.

While the annealing step can take place at a designated annealing station 120, it is also possible for the annealing to take place as the casted polymer wafer moves between casting station 200 and stencil placement station 125 (e.g., on a moving conveyor belt or other transfer mechanism).

Figure 4:
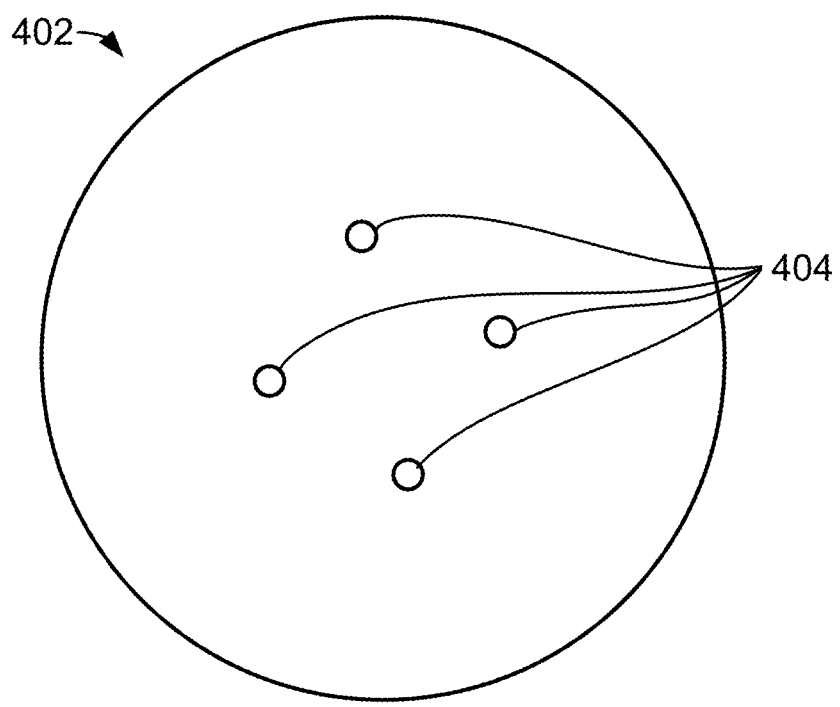
FIG. 4 shows a plan view of an example coating stencil according to an embodiment of the present invention.

FIG. 3 shows a plan view of an example polymer wafer with eyepieces molded therein according to an embodiment of the present invention. FIG. 4 shows a plan view of an example coating stencil according to an embodiment of the present invention.

Referring now to FIGS. 3 and 4, stencil placement station 125 receives a polymer wafer 302 directly or indirectly from the casting station 200 and also receives a stencil 402 from a stencil supply 103 located either inside or outside of enclosure. An alignment step is performed at the stencil placement station 125 to determine a rotational and translational orientation of the stencil 402 with respect to the wafer 302. In some embodiments, alignment is done using computer vision algorithms that reference markers or features on the wafer and on stencil. Precise alignment between the stencil and the wafer causes specific portions of the wafer 302 to remain exposed after the stencil is placed on the wafer. For example, particular patterns or portions of patterns (e.g., diffraction gratings) that are molded into each eyepiece 304a, 304b, 304c, 304d are aligned with and exposed by apertures 404 in the stencil. The remainder of the wafer 302 is covered by the stencil.

In some embodiments, each aperture 404 on the stencil is aligned with a set of incoupling gratings (ICG) molded into each eyepiece 304 on the polymer wafer 302. In some embodiments, the aperture 404 is smaller than the ICG region such that only a portion of the ICG region is exposed. Once aligned, the stencil 402 is removably coupled to the wafer 302 using any suitable means to prevent motion between the stencil and wafer. In some embodiments, the stencil is clamped to the wafer using a magnetic clamp as discussed more fully in relation to FIG. 6F. Although four apertures 404 are illustrated in FIG. 4 in conjunction with the four eyepieces 304a, 304b, 304c, and 304d illustrated in FIG. 3, embodiments of the present invention are not limited to this particular implementation and other numbers of aperture/eyepiece pairs can be utilized, for example, six aperture/eyepiece pairs. Although some embodiments discuss alignment of the wafer to the stencil, in other embodiments, the wafer can be aligned first and the stencil can then be aligned to the wafer. One of ordinary skill in the art would recognize many variations, modifications, and alternatives.

Figure 5:
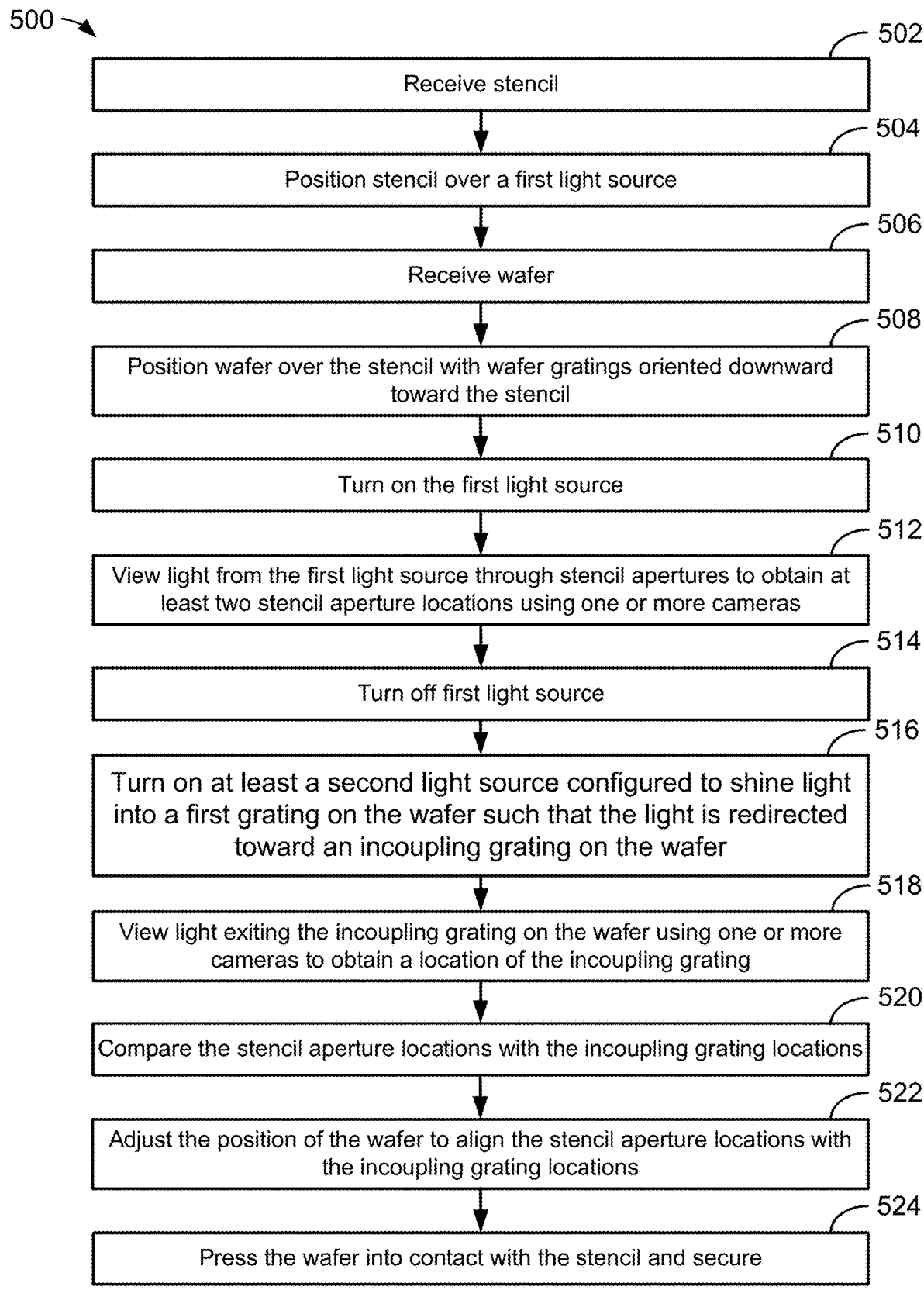
FIG. 5 shows an example process flow for stencil alignment according to an embodiment of the present invention.
Figure 6A:
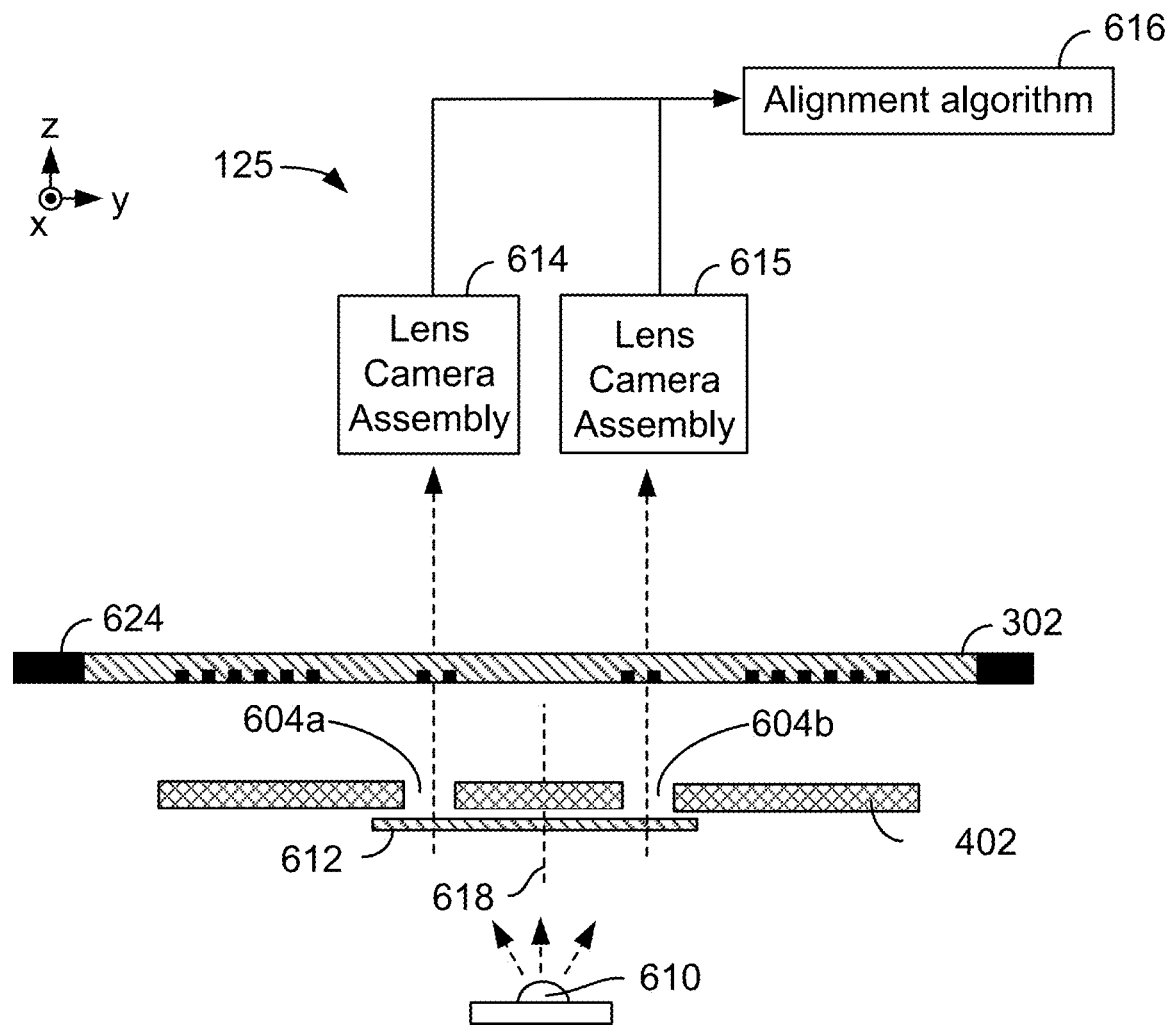
FIG. 6A shows a cross-sectional view of an alignment station at a first process step according to an embodiment of the present invention.
Figure 6B:
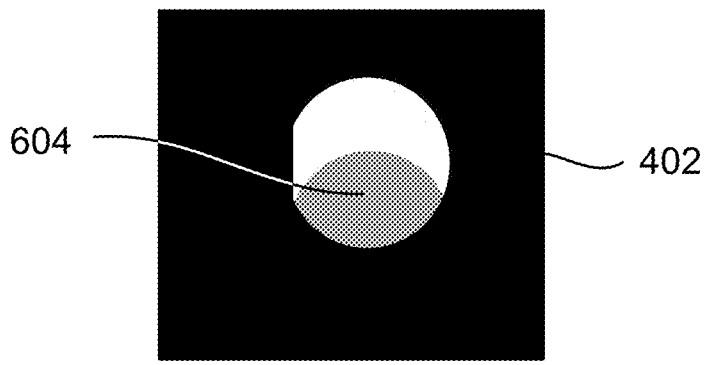
FIG. 6B shows an example image of a backlit stencil cutout according to an embodiment of the present invention.
Figure 6C:
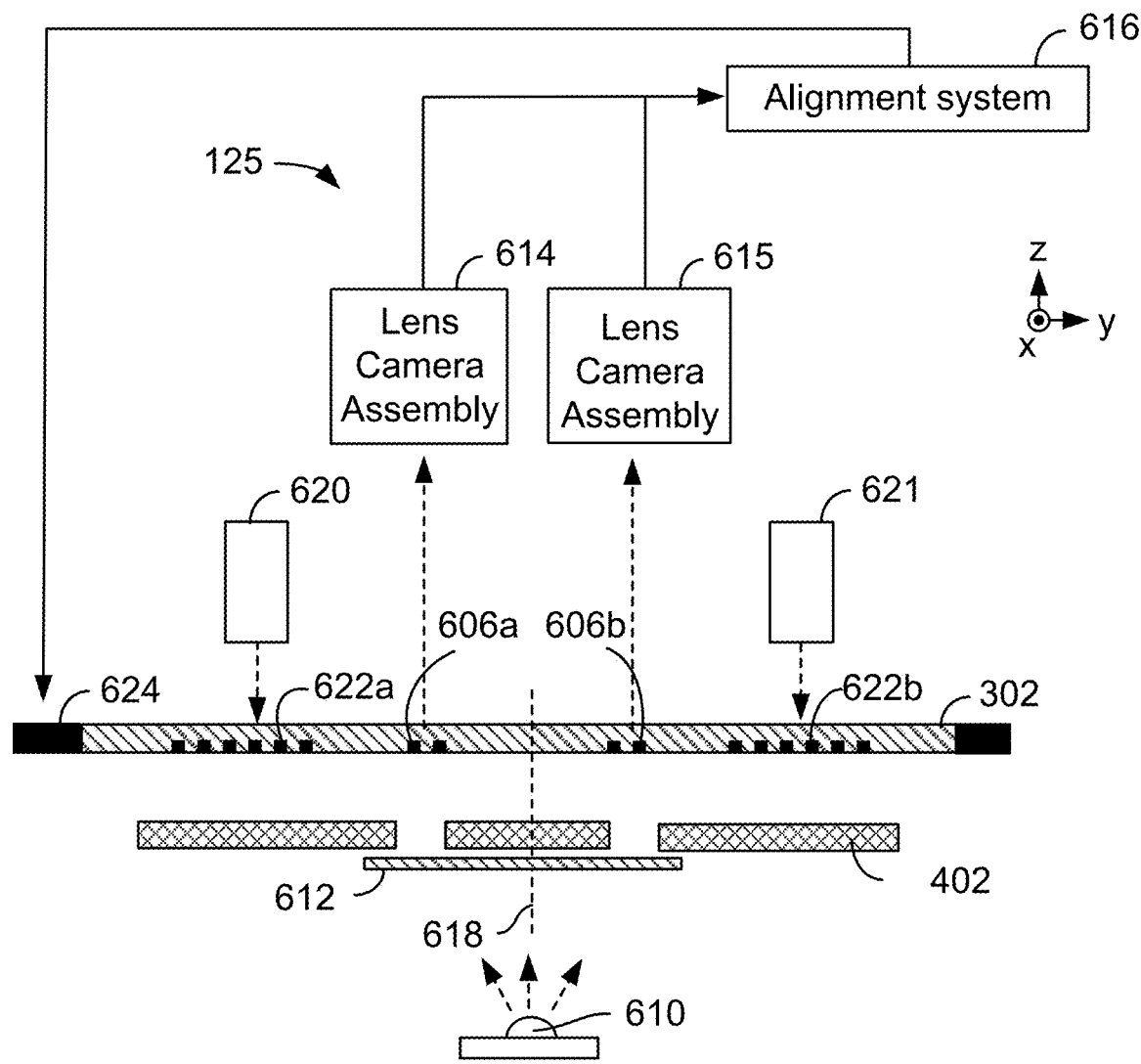
FIG. 6C shows a cross-sectional view of an alignment station at a second process step according to an embodiment of the present invention.
Figure 6D:
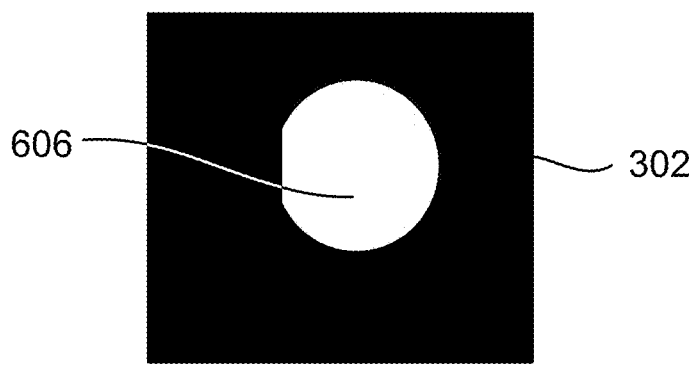
FIG. 6D shows an example image of an illuminated incoupling grating according to an embodiment of the present invention.

FIG. 5 shows an example process flow for stencil alignment according to an embodiment of the present invention. FIG. 6A shows a cross-sectional view of an alignment station at a first process step according to an embodiment of the present invention. FIG. 6B shows an example image of a backlit stencil cutout according to an embodiment of the present invention. FIG. 6C shows a cross-sectional view of an alignment station at a second process step according to an embodiment of the present invention. FIG. 6D shows an example image of an illuminated incoupling grating according to an embodiment of the present invention.

Referring to FIG. 5, an example of an alignment process flow 500 is shown in relation to an example stencil placement station 125 shown at two process steps in FIGS. 6A and 6C. In process 500, a stencil 402 is received by the stencil placement station 125 (502 in FIG. 5). The stencil can be made out of or otherwise include portions of ferromagnetic metal configured to attract to magnetic material. The stencil 402 is opaque such that light does not transmit through the stencil material. The stencil 402 includes at least one aperture 404, also referred to as a cutout. In some embodiments, stencil 402 includes at least one aperture 404 per incoupling grating formed on each of the eyepieces 304a/304b/304c/ 304d on wafer 302.

Stencil 402 is positioned over a first light source 610 (504 in FIG. 5) and the apparatus illustrated in FIG. 6A is utilized to determine the positions of apertures 404 in stencil 402. In some embodiments, a screen 612 is located between the first light source 610 and the stencil 402 to diffuse light from the first light source 610. Accordingly, first light source 610 in conjunction with screen 612 provides a diffuse silhouette of apertures 404. The first light source 610, which can be implemented as an LED, an LED array, or other suitable light source, can be turned on to shine light toward the stencil 402 (510 in FIG. 5), through apertures 604a and 604b, which can also be referred to as cutouts, and into at least one lens and camera assembly 614/615. Referring to FIGS. 4 and 6A, apertures 604a and 604b shown in FIG. 6A correspond to two of the apertures 404 illustrated in FIG. 4. Because FIG. 6A is a cross-sectional view, the other two apertures 404 illustrated in FIG. 4 are positioned such that one aperture is in front of the plane of the figure and the other aperture is positioned behind the plane of the figure. Although, as described more fully in relation to FIG. 6C, wafer 302 including incoupling gratings 606a and 606b is positioned above stencil 402 during imaging of apertures 604a and 604 in some implementations, the inventors have determined that the presence of incoupling gratings 606a and 606b positioned between apertures 604a and 604b and lens and camera assembly 614/615 does not impair the imaging of the apertures. In some implementations, wafer 302 can be positioned as illustrated in FIG. 6C after imaging of the apertures 404. One of ordinary skill in the art would recognize many variations, modifications, and alternatives.

Referring to FIG. 4, apertures 404 illustrated in FIG. 4 are shown as apertures 604 and 604b in FIG. 6A. Light from the first light source that passes through the stencil apertures can be imaged using one or more cameras to obtain at least two stencil aperture locations (512 in FIG. 5). Some configurations can include a single camera to capture light shining through multiple cutouts while other configurations can include two or more cameras, each configured to separately capture light from each cutout as shown in FIG. 6A by lens and camera assemblies 614 and 615. An example image of the backlight captured by the lens and camera assembly through a stencil cutout is shown in FIG. 6B. Once the cutout image is captured by the camera, the first light source can be turned off (514 in FIG. 5).

Images from the lens and camera assembly 614 and 615 are provided as inputs to an alignment system 616, which can include an alignment algorithm, where a center of each imaged lighted portion, corresponding to the center of each imaged stencil cutout, is identified in coordinate points. For example, the alignment algorithm can calculate the center of each cutout in x, y, and theta coordinates. In other embodiments, the geometry of the imaged aperture is characterized by the width and height, which can then be used to compute the center. In some embodiments, in addition to the two apertures 604a and 604b illustrated in FIG. 6A, additional cutouts (not shown) are utilized to improve the alignment accuracy. For example, four cutouts, six cutouts, or the like can be utilized in the alignment process. As discussed more fully herein, the aperture locations will be used in aligning stencil 402 to wafer 302, for example, by minimizing the offset between corresponding apertures and incoupling gratings. As an example, the location of each aperture, for example, in x-y coordinates or pixel coordinates, can be compared to the location of the corresponding incoupling grating and the average distance between the location of each aperture and the location of the corresponding incoupling grating can be minimized.

Referring to FIG. 6C, a wafer is received (506 in FIG. 5) and the wafer is positioned over the stencil with diffraction gratings present in the wafer that are intended to be coated or metalized, oriented facing the stencil (508 in FIG. 5). A small gap (e.g., on the order of several hundred microns to a few millimeters) is provided between the wafer 302 and the stencil 402 so that the wafer position can be adjusted without damaging the surface of the wafer or the gratings disposed thereon. The wafer is approximately aligned with the stencil along a longitudinal axis 618. To make sure the incoupling gratings 606a/606b are aligned with the openings in the stencil, one or more second light sources 620/621, such as a red, green, or blue LED light, illuminate the wafer in the region of a diffraction pattern 622a/622b (516 in FIG. 5). Diffraction pattern 622a can be, for example, a diffraction grating configured to diffract incident light from the second light source 620, directly or indirectly, to the incoupling grating 606a, for example, via total internal reflection inside the wafer. Diffraction pattern 622b can be, for example, a diffraction grating configured to diffract incident light from the second light source 621, directly or indirectly, to the incoupling grating 606b, for example, via total internal reflection inside the wafer. Thus, incoupling grating 606a and diffraction pattern 622a can be considered as corresponding to each other and incoupling grating 606b and diffraction pattern 622b can be considered as corresponding to each other.

In use, diffraction pattern 622a and 622b can each be a combined pupil expander (CPE) that forms an outcoupling grating that can be used to direct image light originating at a projector and diffracted into the plane of an eyepiece waveguide disposed in the wafer via a corresponding incoupling grating 606a/606b to the eye of a user. As will be evident to one of skill in the art, illumination using second light source 620/621 into diffraction pattern 622a/622b, propagation via TIR to incoupling grating 606a/606b, and diffraction of light from the second light source to lens and camera assemblies 614/615 utilizes propagation of light along an optical path that is opposite to the optical path utilized during use of the eyepiece waveguide, with incoupling into the eyepiece waveguide occurring at diffraction grating 622a/622b used for outcoupling to the user and outcoupling occurring from incoupling grating 606a/606b used for incoupling from the projector. One of ordinary skill in the art would recognize many variations, modifications, and alternatives.

When light from the diffraction pattern 622a/622b reaches the incoupling grating 606a/606b, at least some of the light exits the incoupling grating 606a/606b toward the lens and camera assembly 614/615, where an image of the incoupling grating 606a/606b is captured (518 in FIG. 5). An example image of the illuminated incoupling grating is shown in FIG. 6D. It should be noted that the lens and camera assembly 614/615 has a sufficient depth of field to image both stencil 402 and wafer 302 despite the gap between these elements during the alignment process. Although separate lens and camera assemblies 614 and 615 are illustrated in FIG. 6A, embodiments of the present invention are not limited to the use of multiple cameras and a single lens and camera assembly having a field of view that includes the elements to be imaged can be utilized as an alternative to the separate lens and camera assemblies 614 and 615 that are illustrated.

Once the illuminated ICG image is captured, the second light source 620/621 can be turned off. Captured images of at least one of illuminated incoupling gratings 606a/606b are provided to the alignment algorithm 616 where the center of each incoupling grating 606a/606b is identified in coordinate points. For example, the alignment algorithm can calculate the center of each incoupling grating in x, y, and theta coordinates. The incoupling grating coordinates can be compared with the cutout coordinates to determine relative position between the stencil and the wafer (520 in FIG. 5). Any offset between the centers of the incoupling gratings and the corresponding stencil cutouts is calculated and can be used as a basis for adjusting the location of the wafer in x, y, and/or theta directions via the actuatable wafer chuck 624 that holds the wafer at the periphery of the wafer (e.g., using a vacuum gland that contacts the circumference of the wafer) and adjusts the position of the wafer 302 (522 in FIG. 5). One or more of the alignment steps above can be repeated as needed to achieve relative position between the stencil and the wafer that is within a predetermined tolerance.

In some embodiments, a subset of the number of apertures 604a/604b and the number of incoupling gratings 606a/606b can be used in the alignment process. For example, captured images of two illuminated apertures 604a/604b and captured images of two illuminated incoupling gratings 606a/606b can be utilized in the x,y,θ alignment of the wafer to the stencil. In other embodiments, all of the apertures 604a/604b and incoupling gratings 606a/606b (e.g., four or six) can be utilized in the alignment process. The use of a larger number of apertures and incoupling gratings can be advantageous when the incoupling gratings are offset from intended positions, resulting in a registration error between the offset incoupling grating(s) and the corresponding aperture(s) in the stencil. Using a larger number of apertures and incoupling gratings will enable a global adjustment to address such registration errors as the best fit between the group of apertures and incoupling gratings can be used in the alignment process.

In a particular embodiment of the present invention, the alignment algorithm utilizes the center positions of some or all of the apertures and some or all of the incoupling gratings. Utilizing accurate, relative position measurements for the apertures/incoupling gratings, the aperture/incoupling gratings positions measured using the lens and camera assemblies are utilized in a best fit algorithm to minimize the position difference between each aperture and the corresponding incoupling grating. As an example, the center of a best fit circle that passes through all of the measured apertures can be matched to the center of a best fit circle that passes through all of the measured incoupling gratings. Thus, the minimum average position difference can be utilized in adjusting the wafer position in x,y,θ coordinates.

When the alignment is within acceptable tolerance, the wafer is moved into contact with the stencil and a plate made of magnetic material or otherwise housing one or more magnets is placed on top of the wafer to create a magnetic clamp (524 in FIG. 5). In some implementations, the stencil can be positioned against a reference surface (e.g., a vacuum chuck) using vacuum. The magnets on the top plate attract to the ferromagnetic stencil to hold the wafer in place and preserve alignment as discussed in relation to FIG. 6F. The assembly can then be moved to other areas of the tool or can be repositioned without disrupting the precise alignment between stencil and wafer.

In some embodiments, the alignment of the stencil and wafer is verified after the magnetic clamp has been utilized to clamp the wafer to the stencil. Thus, confirmation can be provided that no motion of the wafer with respect to the stencil occurred during the clamping process.

Figure 6E:
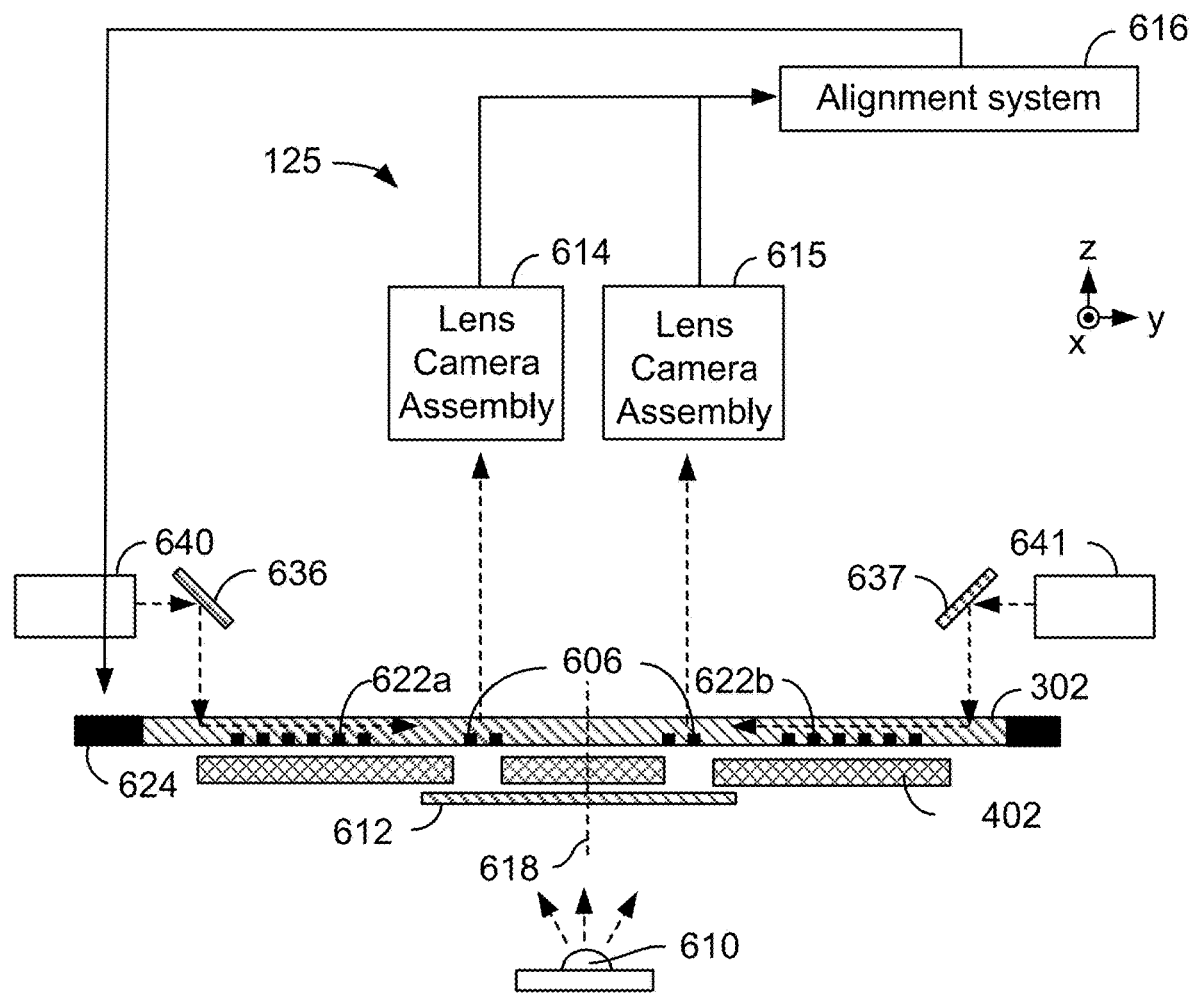
FIG. 6E shows a cross-sectional view of an alignment station at a second process step according to another embodiment of the present invention.

FIG. 6E shows a cross-sectional view of an alignment station at a second process step according to another embodiment of the present invention. As illustrated in FIG. 6E, rather than injecting light into the wafer directly via diffraction gratings 622*a*/622*b*, in the embodiment illustrated in FIG. 6E, light from second light source 640/641 is coupled into the wafer after reflection from mirrors 636/637 and propagates to each incoupling grating 606 via total internal reflection as the light propagates in the eyepiece waveguide. By injecting light into wafer 302 as illustrated in FIG. 6E, second light source 640/641 can be positioned to the sides of wafer 302 at locations that are outside the perimeter of wafer 302, enabling other system elements, including lens and camera assembly 614/615 to be positioned closer to wafer 302 along the z-axis, or the like.

In a particular embodiment, mirrors 636/637 can be implemented as prisms although other reflective structures can be utilized. Additionally, in some embodiments, light from second light source 640/641 can be injected into wafer 302 at a grazing incidence, obviating the use of mirrors 636/637. Thus, embodiments of the present invention can utilize diffraction gratings 622*a*/622*b*, as illustrated in FIG. 6C to couple light into the wafer, or other methods of injecting light into the wafer, as illustrated in FIG. 6E, to provide light that can be outcoupled from incoupling gratings 606. One of ordinary skill in the art would recognize many variations, modifications, and alternatives.

Figure 6F:
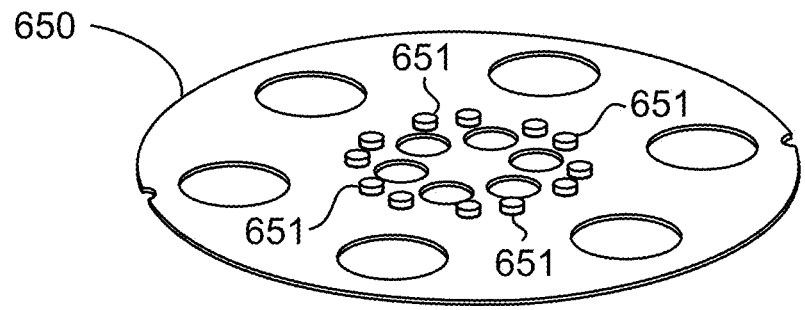
FIG. 6F is an exploded perspective view of a clamping system according to an embodiment of the present invention.
Figure 6F:
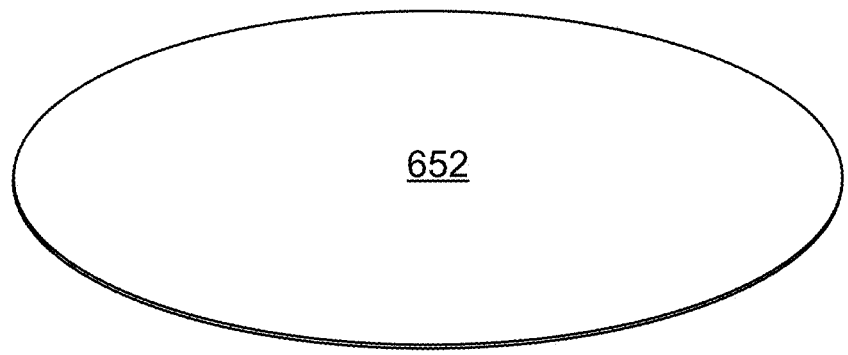
Figure 6F:
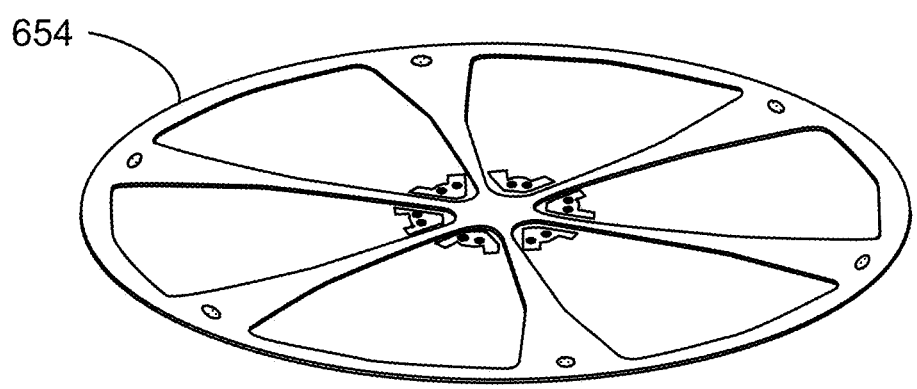

FIG. 6F is an exploded perspective view of a clamping system according to an embodiment of the present invention. As illustrated in FIG. 6F, a magnetic clamp 650 is utilized in conjunction with wafer 652 and stencil 654 to magnetically clamp the wafer to the stencil using magnetic force. Magnetic clamp 650 includes a plurality of magnets 651 that are disposed or arrayed at various positions on the upper surface of the magnetic clamp. In the illustrated example, 12 magnets 651 are utilized, but the present invention is not limited to this particular number and other numbers can be utilized according to other embodiments. Stencil 654 is made from a magnetic material such as stainless steel although other suitable magnetic materials can be utilized.

As magnetic clamp 650 is placed adjacent stencil 654, wafer 652 is clamped between the magnetic clamp and the stencil, enabling the registration obtained as discussed in relation to FIG. 5 to be maintained during subsequent processing operations.

Figure 7:
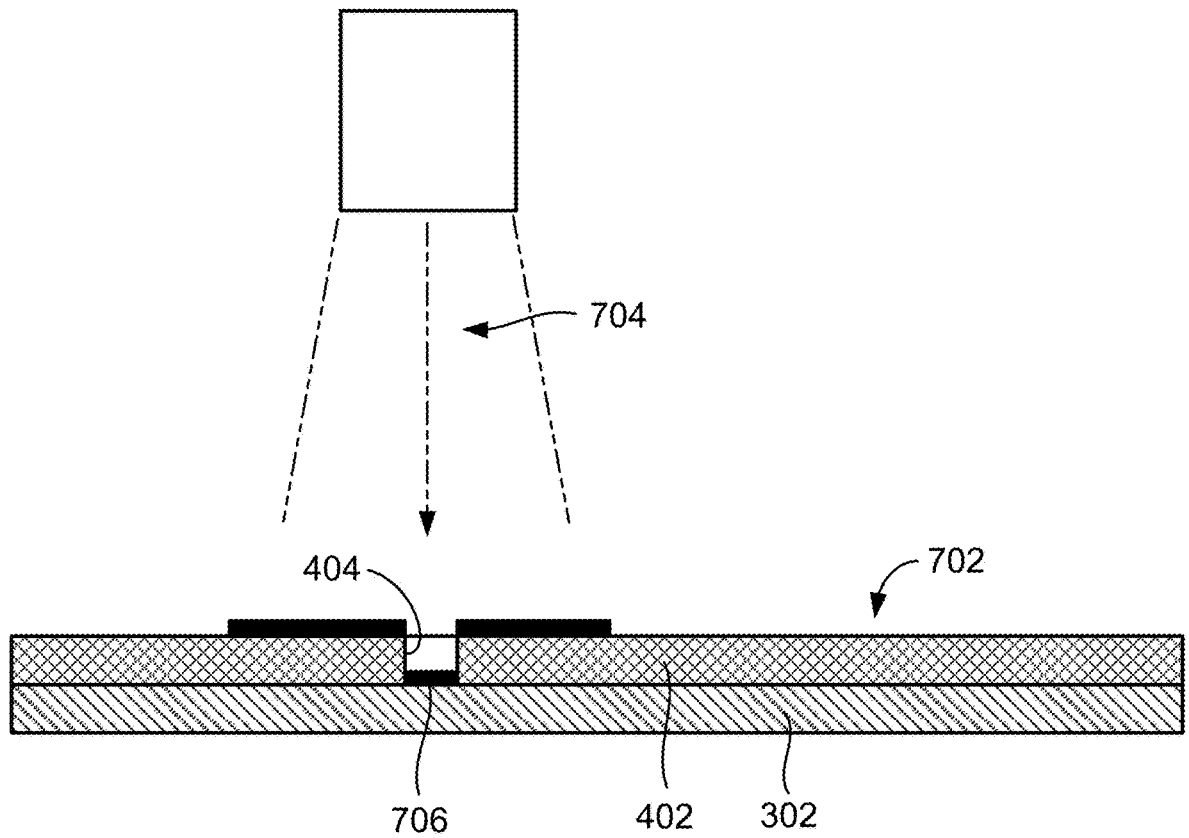
FIG. 7 shows a cross-sectional view of an example stencil and wafer assembly in a coating deposition station according to an embodiment of the present invention.

FIG. 7 shows a cross-sectional view of an example stencil and wafer assembly in a coating deposition station according to an embodiment of the present invention. As illustrated in FIG. 7, assembly 702 is shown and includes the stencil 402 removably coupled to the wafer 302. Assembly 702 can be moved to a deposition station 130 where a coating material 704 such as a metal or a high index inorganic material is deposited over the stencil 402, through apertures 404, and onto exposed portions of the polymer wafer 302. The coating deposition process can occur in a vacuum deposition chamber in deposition station 130 (illustrated in FIG. 1).

The deposited coating material is received by deposition station 130 from a coating material supply 104 (illustrated in FIG. 1) and is deposited over the stencil to form a layer 706 on one or more regions of the polymer wafer 302 (e.g., on at least a portion of the ICG regions of each eyepiece). The size and shape of the layer 706 is constrained by the size and shape of the aperture 404 of stencil 402. While circular apertures 404 are shown, apertures with shapes such as squares, ovals, rectangles, polygons, or other shapes can also be used. The coating material can be a material such as aluminum, silver, titanium dioxide, zirconium dioxide, or other suitable reflective materials.

After the coating deposition step is complete, stencil 402 is removed from wafer 302 by lifting the stencil upward in a direction substantially perpendicular to the face of the wafer that has been coated with layer 706. Such a stencil removal technique can minimize damage to the layer 706. Used stencils can be discarded to used stencil bin 105 (illustrated in FIG. 1) that is inside or outside of the enclosure 112 of tool 110. Stencil separation can occur in a stencil separation station 135 (illustrated in FIG. 1).

Alternative coating materials and methods for depositing flowable coating materials can be used instead of or in addition to the deposition techniques discussed above. Such techniques are described in U.S. Pat. No. 10,436,968, filed Apr. 16, 2018 and U.S. Patent Application Publication No. 2018/0329132, filed Jul. 23, 2018, each of which is hereby incorporated by reference in its entirety.

Although not illustrated in FIG. 7, embodiments of the present invention can utilize magnetic clamp 650 illustrated in FIG. 6F. In this embodiment, the magnetic clamp would be positioned below wafer 302, applying a vertical force to wafer 302 to force the wafer towards stencil 402, thereby maintaining the alignment between the wafer and the stencil.

Figure 8:
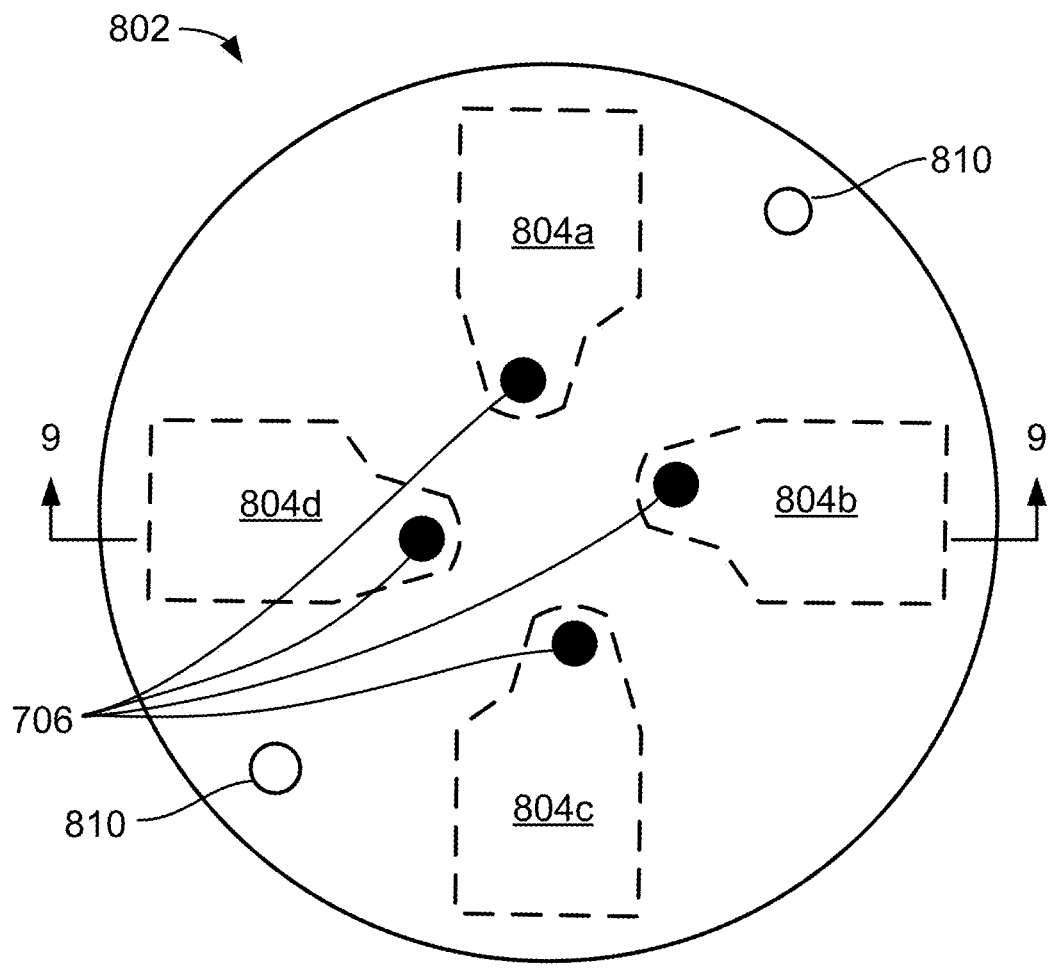
FIG. 8 shows a plan view of a coated polymer wafer according to an embodiment of the present invention.
Figure 9:
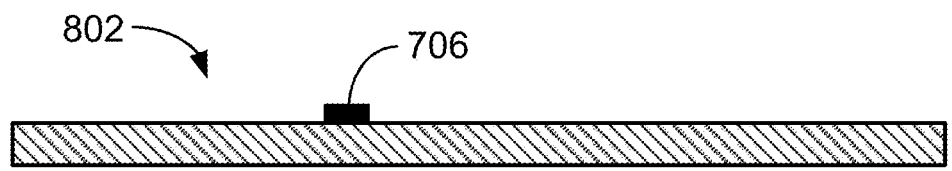
FIG. 9 shows a cross-sectional view of the coated polymer wafer of FIG. 8.

FIG. 8 shows a plan view of a coated polymer wafer according to an embodiment of the present invention. FIG. 9 shows a cross-sectional view of the coated polymer wafer of FIG. 8. As illustrated in FIGS. 8 and 9, an example coated wafer 802 is illustrated following stencil removal. Eyepieces 804*a*, 804*b*, 804*c*, and 804*d* molded within coated wafer 802 each have a coating layer 706 disposed thereon. While one layer 706 per eyepiece 804 is shown, it is possible for multiple layers 706 to be deposited on each eyepiece 804, depending on the design of the stencil. Additionally, while the multiple eyepieces 804 are shown arranged in a pinwheel layout, other layouts are possible depending on the size and shape of the eyepieces and wafers. Stencils can be correspondingly designed so that when the stencil is overlaid on the wafer, the desired areas of the wafer are exposed.

Referring once again to FIG. 1, tool 110 can include an inspection station 140 to evaluate the coated wafer 802 after stencil removal and qualify the coated wafer 802 to continue with stack assembly based on various metrics. In some embodiments, the inspection unit can check to make sure that the wafer shape, grating shapes, grating positions, deposition layer shape, deposition layer position, and deposition layer adherence are within a selected tolerance. In some embodiments, computer vision systems or other suitable measurement tools can be used to obtain these measurements. If the inspection station 140 determines that the coated wafer 802 does not pass quality standards, the wafer can be pulled from the assembly line and placed in a wafer discard bin 106 (illustrated in FIG. 1) either inside or outside of the enclosure 112 of tool 110. Wafers that pass inspection can move forward in the tool's workflow.

Coated wafers are transferred to a layer assembly station 145. To begin assembly of a multi-layered polymer stack, a first coated wafer is received at the layer assembly station 145. Layer assembly station 145 also receives a first spacer, such as spacer 1002, which is shown in plan view in FIG. 10, from spacer preparation station 150 which will be discussed in further detail below.

Figure 10:
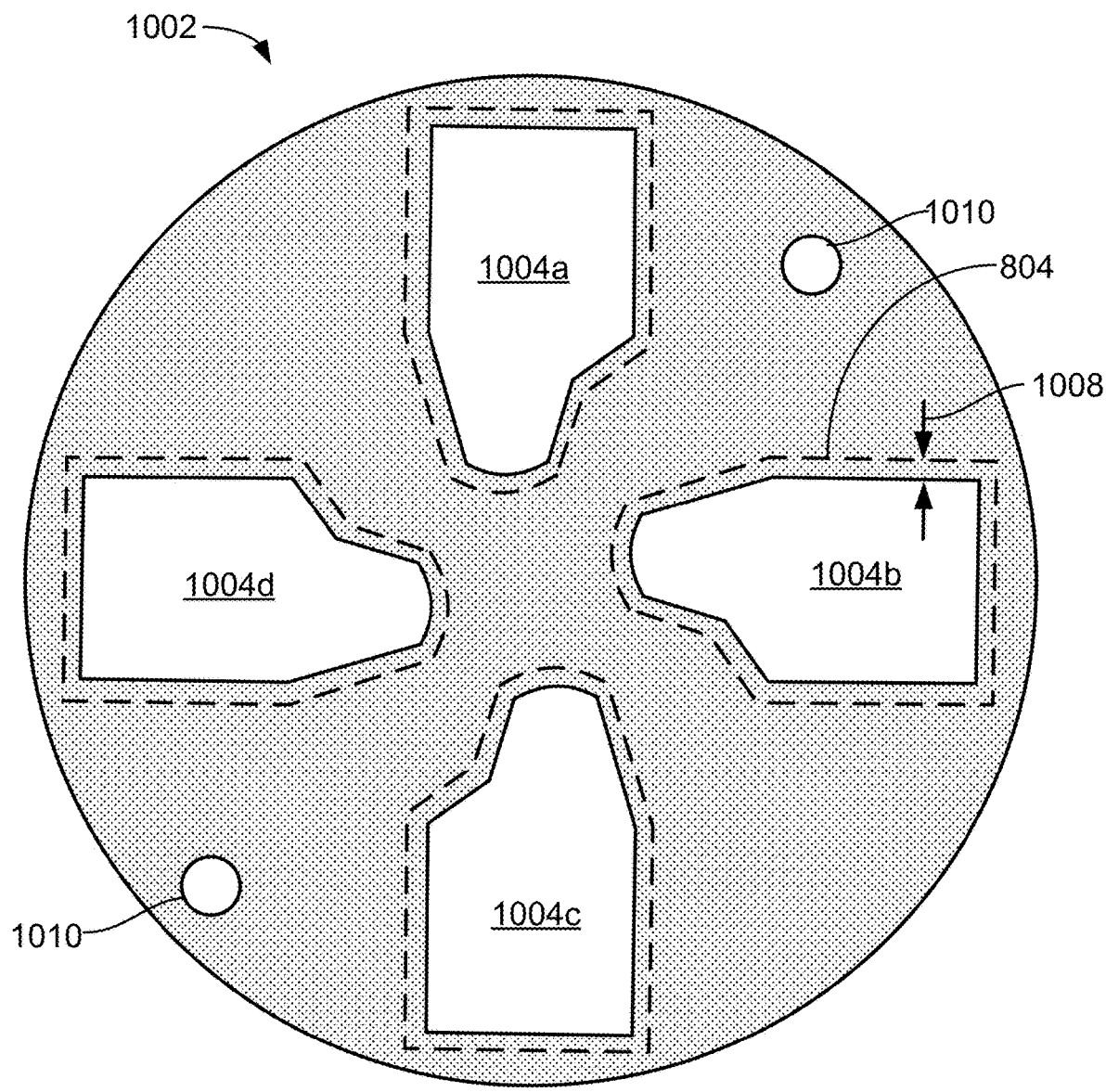
FIG. 10 shows a plan view of an example spacer according to an embodiment of the present invention.

FIG. 10 shows a plan view of an example spacer according to an embodiment of the present invention. Spacer 1002 can be similar in shape to the casted polymer wafer; however, the spacer includes cutouts 1004*a*/1004*b*/1004*c*/1004*d* configured to be aligned with the eyepieces molded into the polymer wafer. The cutouts 1004 are generally slightly smaller than the outer boundaries of the eyepiece 804 such that the spacer overlaps the perimeter of the eyepiece molded into the wafer at an overlap region 1008. In some embodiments, the overlap region can be less than 1 mm in width or can be between approximately 1 mm and approximately 5 mm in width. Other overlap region widths are possible depending on the amount of edge reinforcement desired in the multilayered stack.

The spacer 1002 is aligned over a coated wafer using computer vision systems to recognize various features or markers on one or more of the spacer and the coated wafer. In embodiments where at least a portion of the spacer is a transparent substrate, alignment methods can be used such as those discussed in International Patent Application No. PCT/US2019/036380 filed Jun. 10, 2019, which is hereby incorporated by reference in its entirety.

The spacer 1002 includes an adhesive material on a first surface (e.g., a bottom surface) that faces the coated wafer. When the orientation and alignment of the spacer over the wafer is complete, the adhesive on the first surface of the spacer is pressed into contact with the wafer to fix the spacer to the wafer. A second wafer can be adhered to the to a second surface (e.g., a top surface) of the first spacer using the same method of pressing the adhesive layer on the spacer into contact with the second wafer and allowing the adhesive to set. Additional layers can be added to the stack in the same way.

In some embodiments, the adhesive is a high index adhesive and can be formed as a double-sided adhesive tape. The adhesive can be a UV-curable material and can utilize a step of exposing the adhesive to UV light while the spacer and wafer are in contact. The adhesive material can be transparent or can include carbon or dye additives to make the adhesive layer optically opaque or semi-opaque. The carbon or dye additives can give the adhesive a dark color, such as a dark gray or black. Adhesive layers can be present on the top and/or bottom of the spacer so that wafers can be adhered to the top and/or bottom surfaces of the spacer during the stacking assembly process at layer assembly station 145.

To prevent contaminants from sticking to the spacer adhesive when the spacer is in storage in spacer supply bin 108 (illustrated in FIG. 1) prior to assembly with the wafer, a protective film can be removably adhered to the adhesive layers on top and/or bottom surfaces of the spacer. Spacer preparation station 150 is configured to remove a first protective film from a first surface (e.g. the bottom surface) of the spacer such that a first layer of adhesive is exposed prior to delivering the spacer to layer assembly station 145 (both illustrated in FIG. 1). In some embodiments, a second protective film remains in place on a second surface (e.g. the top surface) of the spacer during transfer and assembly to a first wafer. Once the spacer is aligned and fixed to the first wafer at the previously exposed adhesive surface, the layer assembly station can remove the second protective film from the second surface (e.g. the top surface) in preparation for stacking a second wafer on top of the spacer. It may be advantageous to minimize the amount of time between the steps of removing the protective film and adhering the exposed adhesive to a wafer in order to reduce the risk of contamination or other damage to the adhesive layer.

When using adhesives that require a UV or thermal curing step, the UV or thermal exposure can occur after each step where a wafer and spacer are pressed into contact. Alternatively, the full stack of wafer and spacer layers can be assembled prior to delivering a UV and/or thermal cure dose.

Referring to FIG. 1, while a distinct spacer preparation station 150 is described, it is also possible for the layer assembly station 145 to remove and discard protective film from the spacer layers, thereby integrating the function of the spacer preparation station 150 into layer assembly station 145.

By stacking alternating layers of wafers and spacers, a multi-layered polymer eyepiece stack is assembled. In some embodiments, the stack includes at least three wafers and at least two spacers.

Figure 11:
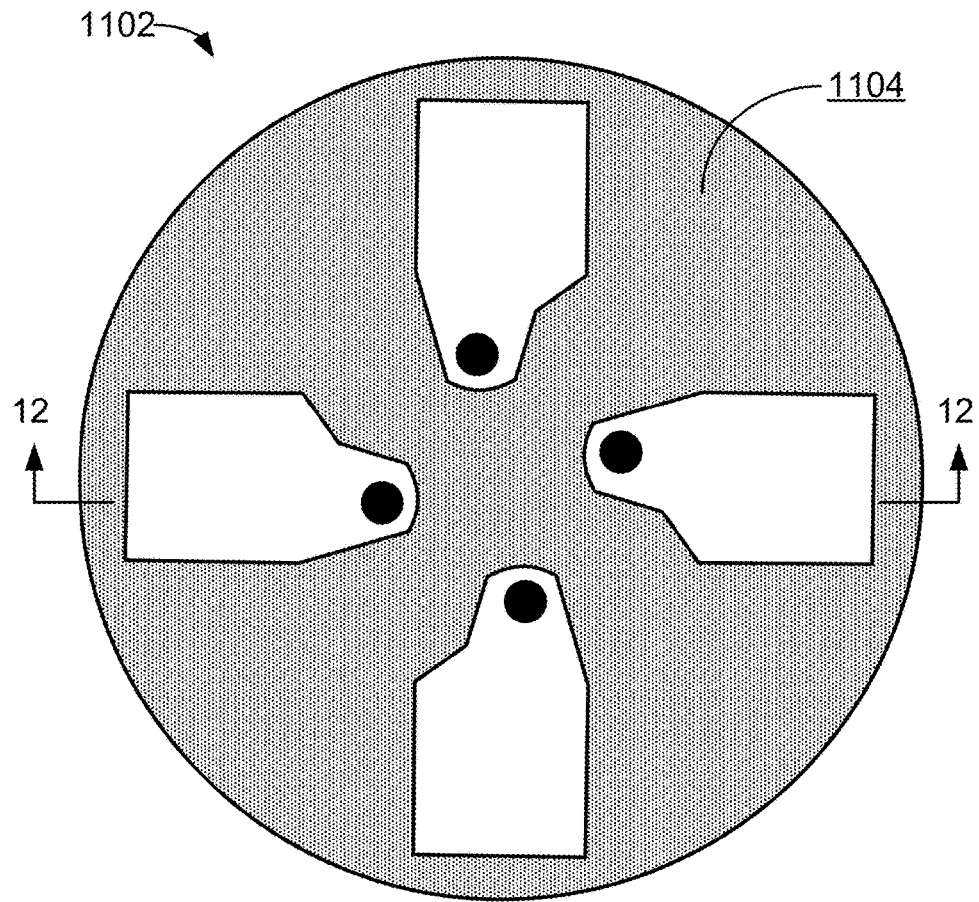
FIG. 11 shows a plan view of an example multi-layered polymer wafer stack according to an embodiment of the present invention.
Figure 12:
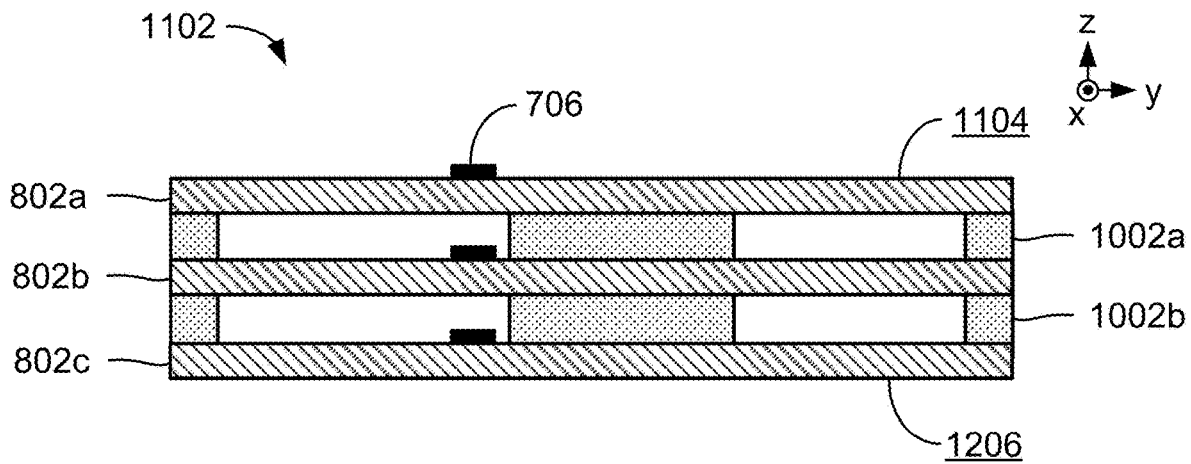
FIG. 12 shows a cross-sectional view of the multi-layered polymer wafer stack of FIG. 11.

FIG. 11 shows a plan view of an example multi-layered polymer wafer stack according to an embodiment of the present invention. FIG. 12 shows a cross-sectional view of the multi-layered polymer wafer stack of FIG. 11. Thus, FIG. 12 illustrates a multi-layered polymer wafer stack 1102 including a plurality of wafers 802 and spacers 1002. In some embodiments, the multi-layered polymer wafer stack 1102, which can also be referred to as a stack, includes at least six wafers and at least five spacers. A stack with any number of layers can be assembled. Once the stack is complete, the layer assembly station 145 can optionally cover the top surface 1104 and the bottom surface 1206, with a protective film to reduce risk of damage to the completed stack.

In order to provide alignment between wafers 802 and spacers 1002, fiducials can be placed on wafer 802 and spacers 1002 to facilitate registration between layers in the multi-layered polymer wafer stack 1102. As an example, referring to FIG. 10, fiducials 1010 fabricated on spacer 1002 could be used with corresponding fiducials 810 (shown in FIG. 8) fabricated on wafer 802. In the illustrated example, fiducials 810 have a smaller diameter than fiducials 1010, enabling alignment of wafer 802 to spacer 1002. Although circular fiducials are illustrated, it will be appreciated that other shapes, dimensions, positions, and numbers of fiducials can be utilized according to embodiments of the present invention.

As the thickness of multi-layered polymer wafer stack 1102 increases, alignment cameras having a large depth of field can be utilized to image fiducials at various depths in the stack. Alternatively, alignment camera position can be modified as the stack is assembled in order to provide imaging of the fiducials on the wafers and the spacers. One of ordinary skill in the art would recognize many variations, modifications, and alternatives. In an alternative embodiment, cover plates are utilized and bonded to wafers 802$a$ and 802$c$ using appropriate spacers (not shown) in order to maintain the integrity of the top surface 1104 of wafer 802$a$ and the bottom surface 1206 of wafer 802$c$. As will be evident to one of skill in the art, the use of cover plates will enable an air gap to be provided adjacent incoupling grating 606$a$/606$b$ and diffraction pattern 622$a$/622$b$, thereby facilitating total internal reflection and preventing dust and debris from accumulating on optical surfaces.

In the embodiment illustrated in FIG. 12, each instance of layer 706, which are aligned with incoupling gratings in each of the eyepiece waveguides, are aligned along a single axis aligned with the z-axis. In other embodiments, for example, to implement sub-pupil designs, the incoupling gratings and corresponding layers 706 can be spatially offset, i.e., laterally offset, in the x-y plane. In these embodiments, fiducials that are spatially offset from wafer to wafer and spacer to spacer in a predetermined manner can be utilized to achieve the desired positioning between adjacent incoupling gratings as appropriate for the particular sub-pupil design. One of ordinary skill in the art would recognize many variations, modifications, and alternatives.

On completion of stack assembly, the stack can optionally move to a stack inspection station 155 (illustrated in FIG. 1). Inspection of the stack can include steps of measuring alignment between layers and/or checking light output metrics such as contrast, uniformity, and/or brightness of an image projected through the stack. Stacks with measurements within a threshold tolerance can pass into a completed stack collection bin 109 while stacks that do not pass quality standards can be moved into a discard bin 911 (both illustrated in FIG. 1). Stack collection bin 109 and stack discard bin 111 can be inside or outside of the enclosure 112 of tool 110.

Several stations are discussed above describing various fabrication or assembly steps performed at each station. Transfer of components between the stations can be achieved using conveyors, transfer arms with vacuum attachments, movable stages, or other component transfer means. Components can be moved between stations individually or can be collected at one station and moved to another station as a batch. Intermediate storage areas can be provided between any of the described stations to temporarily hold wafers, spacers, and/or assemblies for later batch transfer.

Completed stacks can exit the enclosure 112 of tool 110 where further processing steps such as singulation (i.e., cutting the stacked wafers into individual eyepieces) by milling, laser cutting, water jetting, die cutting, or other singulation means can occur. Edges of the singulated eyepiece stacks can be coated with an adhesive material, such as a high index UV-curable adhesive doped with carbon nano-powder, meso-porous carbon, carbon black, various dyes, or combinations thereof.

Singulation and edge coating steps can occur outside of enclosure 112 of tool 110 so that debris created by the singulation process does not contaminate other processes occurring within the enclosure 112. However, it is also possible to create one or more containment areas within enclosure 112 where singulation and/or edge coating steps can be performed in isolation from other fabrication and assembly steps. Such an isolation area can prevent transfer of debris, vibrations, or fumes into other areas of the enclosure 112. In some embodiments, enclosure 112 is substantially similar to a clean room environment. In some embodiments, venting of the enclosure 112 and/or isolation areas within enclosure 112 to the exterior of the tool 110 allows for controlled circulation of filtered air to remove contaminants and/or fumes from inside of the enclosure 112.

While several examples of fabrication and assembly steps are discussed herein for creating a multi-layered polymer eyepiece stack within an enclosed tool, equipment stations and process steps can be added or removed to optimize the tool to build a particular product. Numerous changes, modifications, variations, substitutions and equivalents will be apparent to those skilled in the art without departing from the spirit and scope of this disclosure.

What is claimed is:

1. A method of aligning a stencil to an eyepiece wafer, the method comprising:
    providing the stencil;
    positioning the stencil with respect to a first light source;
    determining locations of at least two stencil apertures;
    providing the eyepiece wafer, wherein the eyepiece wafer includes at least two eyepiece waveguides, each eyepiece waveguide including an incoupling grating and a corresponding diffraction pattern;
    directing light from one or more second light sources to impinge on each of the corresponding diffraction patterns and propagate through each corresponding eyepiece waveguide by total internal reflection;
    imaging light diffracted from each incoupling grating;
    determining at least two incoupling grating locations;
    determining offsets between corresponding stencil aperture locations and incoupling grating locations; and
    aligning the stencil to the eyepiece wafer based on the determined offsets.

2. The method of claim 1 wherein the at least two stencil aperture locations comprise four aperture locations or six aperture locations.

3. The method of claim 1 wherein determining the at least two stencil aperture locations comprises:
    imaging light from the first light source using a first camera after the light from the first light source passes through a first aperture of the at least two stencil apertures; and imaging light from the first light source using a second camera after the light from the first light source passes through a second aperture of the at least two stencil apertures.

4. The method of claim 1 wherein determining the at least two stencil aperture locations comprises:
imaging light from the first light source using a camera after the light from the first light source passes through a first aperture of the at least two stencil apertures; and
imaging light from the first light source using the camera after the light from the first light source passes through a second aperture of the at least two stencil apertures.

5. The method of claim 1 further comprising, after directing light from each of the one or more second light sources to impinge on each of the corresponding diffraction patterns, redirecting at least a portion of the light from each of the one or more second light sources to each of the incoupling gratings via total internal reflection.

6. The method of claim 1 wherein imaging light diffracted from each incoupling grating comprises:
imaging light from a primary light source of the one or more second light sources using a first camera after the light from primary light source diffracts from a first incoupling grating of the incoupling gratings; and
imaging light from a secondary light source of the one or more second light sources using a second camera after the light from the secondary light source through a second incoupling grating of the incoupling gratings.

7. The method of claim 1 wherein imaging light diffracted from each incoupling grating comprises:
imaging light from a primary light source of the one or more second light sources using a camera after the light from the primary light source diffracts from a first incoupling grating of the incoupling gratings; and
imaging light from a secondary light source of the one or more second light sources using the camera after the light from the secondary light source diffracts from a second incoupling grating of the incoupling gratings.

8. The method of claim 1 wherein aligning the stencil to the eyepiece wafer comprises moving the eyepiece wafer with respect to the stencil to reduce the determined offsets.

9. The method of claim 8 wherein moving the eyepiece wafer comprises translating and rotating the eyepiece wafer and reducing the determined offsets comprises minimizing the determined offsets.

10. The method of claim 1 wherein the at least two eyepiece waveguides are disposed in a lateral plane and correspond to a first eyepiece waveguide having a first diffraction pattern and a first incoupling grating and a second eyepiece waveguide having a second diffraction pattern and a second incoupling grating.

11. The method of claim 10 wherein the first incoupling grating is disposed in the lateral plane at a first lateral position and the first diffraction pattern is disposed in the lateral plane at a second lateral position laterally offset from the first lateral position, and wherein the second incoupling grating is disposed in the lateral plane at a third lateral position and the second diffraction pattern is disposed in the lateral plane at a fourth lateral position laterally offset from the third lateral position.

* * * * *